United States Patent [19]

French

[11] 4,229,754
[45] Oct. 21, 1980

[54] CCD IMAGER WITH MULTI-SPECTRAL CAPABILITY

[75] Inventor: Barry T. French, Placentia, Calif.

[73] Assignee: Rockwell International Corporation, El Segundo, Calif.

[21] Appl. No.: 972,761

[22] Filed: Dec. 26, 1978

[51] Int. Cl.³ .................... H01L 27/14; H01L 29/78
[52] U.S. Cl. ........................................ 357/30; 357/24; 307/221 D
[58] Field of Search ................. 357/30, 24; 307/221 D

[56] References Cited

U.S. PATENT DOCUMENTS

| | | | |
|---|---|---|---|
| 3,739,240 | 6/1973 | Krambeck | 317/235 R |
| 3,792,322 | 2/1974 | Boyle | 317/235 R |
| 3,863,065 | 1/1975 | Kosonocky | 250/211 J |
| 3,864,722 | 2/1975 | Carnes | 357/24 |
| 3,896,484 | 7/1975 | Nishizawa | 357/24 |
| 3,906,543 | 9/1975 | Smith | 357/24 |
| 3,985,449 | 10/1976 | Patrin | 356/173 |
| 4,087,832 | 5/1978 | Jambotkar | 357/24 |
| 4,099,197 | 7/1978 | Ibrahem | 357/24 |
| 4,142,109 | 2/1979 | Knauer | 307/221 |
| 4,142,198 | 2/1979 | Finnila | 357/24 |

OTHER PUBLICATIONS

Barsan, *Int. J. Electronics*, 1978, vol. 44, No. 1, pp. 97–104.

*Primary Examiner*—Martin H. Edlow
*Attorney, Agent, or Firm*—H. Fredrick Hamann; Harry John Staas

[57] ABSTRACT

A CCD imager for extracting the spectral information from impinging photons and having a multiple photon collection structure through which protons must serially traverse. The carriers generated by the impinging photons are collected by two or more collection regions in each resolution element and the ratio of the relative responses of each of the collection regions can be used to derive spectral information. The CCD imager is fabricated such that both the holes and the electrons generated by the impinging photons are collected, detected, stored, and transferred. Furthermore, the collection of both the holes and the electrons generated by the impinging photons in the CCD imager enables the generation of spectral information without degradation of detector quantum efficiency and can further enable the generation of complete spectral information when used to detect impinging photons comprising mono-energetic optical signals.

7 Claims, 24 Drawing Figures

CCD IMAGER WITH MULTI-SPECTRAL CAPABILITY

BACKGROUND OF THE INVENTION

1. Field of the Invention

The present invention relates to charge coupled devices and more particularly to charge coupled imagers having multispectral capability.

2. Description of the Prior Art

CCD imagers are well known in the prior art and have been used to replace vidicon tubes in black and white television cameras. For use in color TV applications, it has been necessary to use three CCD devices in conjunction with optical band-pass filters and appropriate image splitting optics to generate the conventional tri-color electrical signals.

The prior art requirement of multiple imager devices and their attendant multiple band-pass filters and sophisticated optics has precluded their widespread use in color TV applications. This is due to the fact that the separate CCD imagers and their band-pass filters must be matched as to their characteristics and the beam splitting optics must be carefully collimated in order to insure the proper operation of the resultant color TV camera. Furthermore, the optical band-pass filters and beam splitting optics add considerable weight and size to the camera. A color TV camera utilizing a CCD imager in accordance with the present invention eliminates the necessity for optical band-pass filters and beam splitting optics, thus allowing the fabrication of low-cost, lightweight color TV camera.

The CCD imager in accordance with the present invention is fabricated so as to have multiple collector structures utilizing multiple buried layers. The concept of using CCD devices having more than one buried layer is known in the art. For example, Krambeck, U.S. Pat. No. 3,739,240, is but one example of prior art which teaches a double buried channel CCD device. However, Krambeck does not teach or disclose a CCD device capable of collecting, detecting, storing, and transferring both holes and electrons as in the CCD imager in accordance with the present invention.

SUMMARY OF THE INVENTION

The present invention is directed toward a CCD imager capable of determining both the frequency and intensity of impinging photon radiation. This is accomplished by means of a charge transfer device having multiple layers and multiple collection structures to collect both majority and minority carriers generated by the impinging photons. By the use of a semiconductor in which the depth at which a photon is absorbed is a function of the wavelength of the photon and utilizing the differences in the collection efficiency of the multiple collection structures with respect to the majority and minority carriers, a CCD imager may be fabricated so as to generate spectral information without the use of optical band-pass filters and multiple sensors.

Another object of the present invention is to provide a CCD imager capable of uniquely determining the photon energy of mono-energetic optical signals using only two collection regions for each resolution element.

Another object of the present invention is to provide a CCD imager capable of discerning a black body photon distribution using only two collection regions for each resolution element.

DESCRIPTION OF THE PREFERRED EMBODIMENTS

The following is a description of a two-region per resolution element CCD imager in accordance with the present invention. When used in conjunction with mono-energetic optical signals, the two-region imager is capable of determining the photon energy distribution and, as will be explained later, may be used as the basis for a color TV camera.

Figure 1:
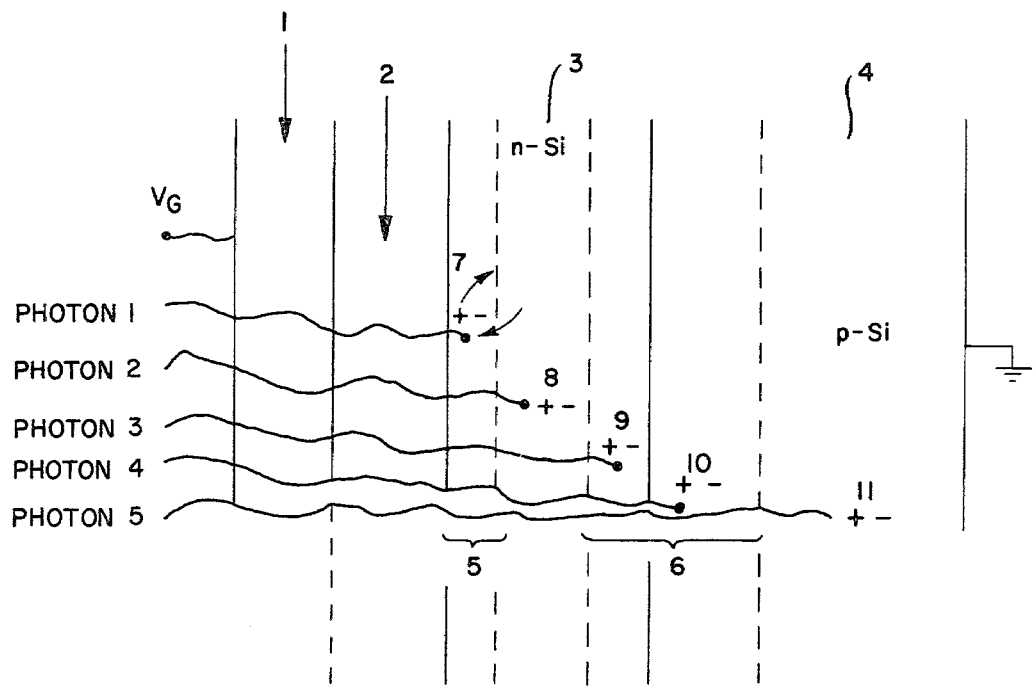
FIG. 1 illustrates a cross-sectional view of a two-region photon collector using an N-channel CCD structure.
Figure 2:
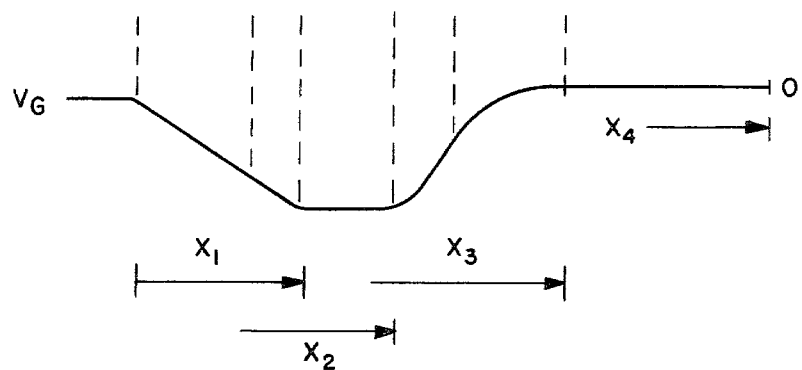
FIG. 2 illustrates, in the same physical scale of FIG. 1, the potential diagram of the two-region photon collector whose cross-sectional view is illustrated in FIG. 1.

FIG. 1 illustrates the cross-sectional view of a two-region photon collector using an N-channel CCD structure. FIG. 2 is of the same physical scale as FIG. 1 and illustrates a potential diagram of the two-region photon collector illustrated in FIG. 1.

As can be seen from FIG. 1, the collector consists of a transparent gate electrode 1 adjacent to a transparent insulator 2 adjacent to the storage channel region 3. The backwall region 4 is, of course, adjacent to the storage channel. Also illustrated is the depletion region 5 present at the interface between the insulator 2 and storage channel 3. There is a second depletion region 6 located at the interface between the storage channel 3 and the backwall region 4. Mobile carriers 7–11 have been illustrated as being respectively generated by photons 1–5. It is noted that each photon generates a pair of mobile carriers (i.e.—a hole and a complementary electron).

The carriers generated by photon 1 illustrated in FIG. 1 are disposed of in two different ways. Namely, the electron generated by photon 1 is transported by the electric field present in the collector into the storage channel. The electron in this particular case is a majority carrier and, thus, remains in the storage channel and is transported to the output and detected as a signal. On the other hand, the hole simultaneously generated by photon 1 is carried to the surface of the collector by means of the same electric field. Prior art CCD devices discard the thusly generated hole by permitting it to flow to a nearby channel stop. Accordingly, the information contained by the hole with respect to the position and energy of photon 1 is thus lost. As will be explained later, in a CCD imager in accordance with the present invention, the information contained in the hole will be recovered.

The carriers 8 generated by photon 2 illustrated in FIG. 1 are disposed of in four ways, namely, electrons, being that they are already in the storage region are collected. On the other hand, some of the holes generated by photon 2 diffuse to the back depletion region 6 and are lost. Some of the holes generated by photon 2 diffuse to the front depletion region 5 and are collected. A few of the remaining holes spontaneously recombine with the generated electrons and are lost.

The mobile carriers 9 and 10 generated by photons 3 and 4 illustrated in FIG. 1 are disposed of in two ways, namely, the electrons are transported by the electric field contained within the collector to the storage channel and are collected while simultaneously the holes that are generated are transported to the backwell region 4 and combine with the electrons contained therein so as to be in equilibrium.

The carriers 11 generated by photon 5 are disposed on in two ways, namely, the holes combine with excess electrons in the backwall region 4 as in the case of the holes generated by photons 3 and 4 while some of the electrons generated by photon 5 diffuse to the edge of the depletion region 6 and are subsequently collected.

If the carriers are generated optically by impinging photons using either a front illuminated CCD device or a device with transparent gate electrodes, the hole-electron pair generation rate is equal to:

$$\alpha N_p \gamma e^{-\alpha x}$$

Figure 3:
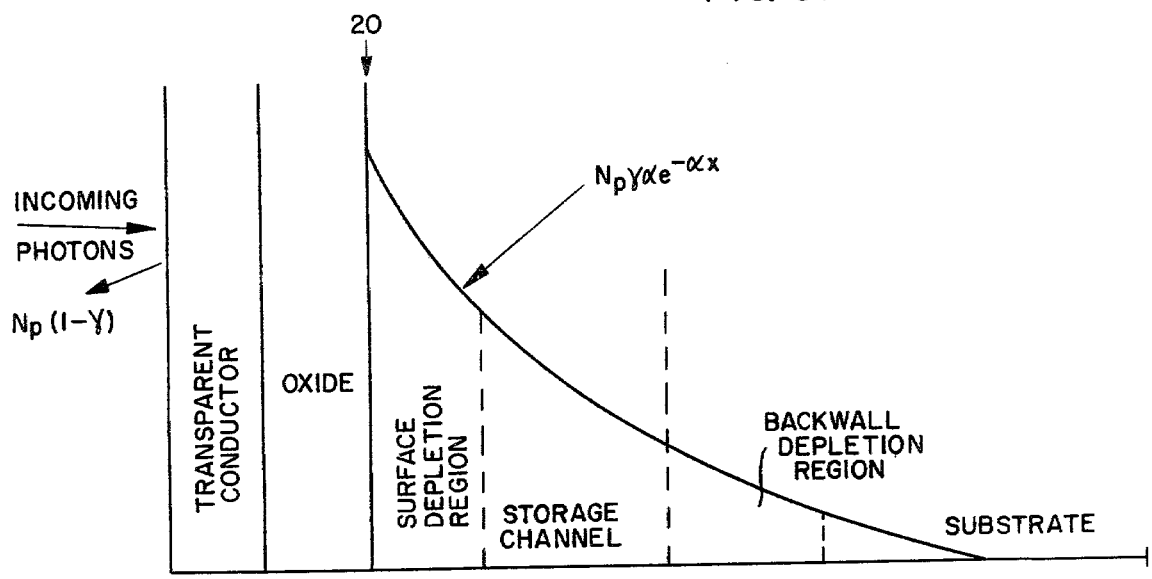
FIGS. 3 and 4 illustrate the relationship between the hole-electron pair generation rate in relation to the depth of penetration of impinging photons in a CCD device.
Figure 4:
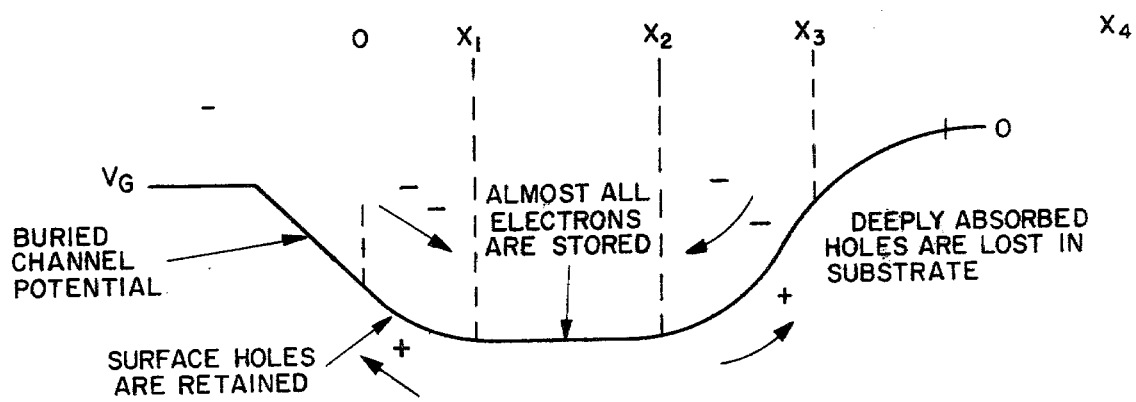

This is illustrated in FIGS. 3 and 4 of the drawing which show the relationship between the hole-electron pair generation rate in relation to the depth of penetration of the impinging photons. Note that if $\alpha$ is very large, most of the carriers are generated near the oxide/silicon interface 20, while if $\alpha$ is small, most of the carriers will be generated a distance away from the oxide/silicon interface 20.

Thus, the following equations may be used to characterize the spectral response of the device to photons in a case of devices fabricated of silicon having a specific absorption coefficient:

$$N_h = N_p \gamma \int_0^{X_2} \alpha e^{-\alpha x} C_h(x)\, dx$$

$$N_e = N_p \gamma \int_0^{X_4} \alpha e^{-\alpha x} C_e(x)\, dx$$

$C(x)$ = device collection function
$N_p$ = no. of photons impinging per unit area
$\alpha$ = optical absorption coefficient
$\gamma$ = surface structure optical transmission coefficient If one assumes the recombination rate in the transfer channel ($X_1 \leq X \geq X_2$), then Table 1 may be used to determine the values of $C(x)$.

TABLE 1

| | Table of Values of $C(x)$ | |
|---|---|---|
| Region | Holes | Electrons |
| $0 \leq X \leq X_1$ | 1 | 1 |
| $X_1 \leq X \leq X_2$ | $\dfrac{X_2 - X}{X_2 - X_1}$ | 1 |
| $X_2 \leq X \leq X_3$ | 0 | 1 |
| $X_3 \leq X \leq X_4$ | 0 | $\exp(-X/L)$  $L = (D\tau)^{\frac{1}{2}}$ |

Substituting the values of $C(x)$ of Table 1 and assuming that there are $N_p$ photons per cm² with a coefficient $\alpha$, the total collection of electrons and holes may be calculated using the following equations:

$$N_h = N_p \gamma \left[ 1 - \frac{e^{-\alpha X_1} - e^{-\alpha X_2}}{\alpha(X_2 - X_1)} \right]$$

$$N_e = N_p \gamma \left\{ [1 - e^{-\alpha X_3}] + \left[ \frac{1 - e^{-(\alpha + 1/L)(X_4 - X_3)}}{(\alpha + 1/L)} \right] e^{-\alpha X_3} \right\}$$

wherein
$N_h$ is the number of holes collected and
$N_e$ is the number of electrons collected.

The spectral information with respect to the impinging photons is determined by the ratio of $N_h$ and $N_e$.

The ratio $N_h/N_e$ was calculated for the "empty well" case, (i.e., $X_2 = X_1 = X_d$ with the simplifying assumption that $L = \infty$ and $X_4 = \infty$). In such a case, no holes are lost and:

$$N_h/N_3 = 1 - e^{-\alpha X_d}.$$

Figure 5:
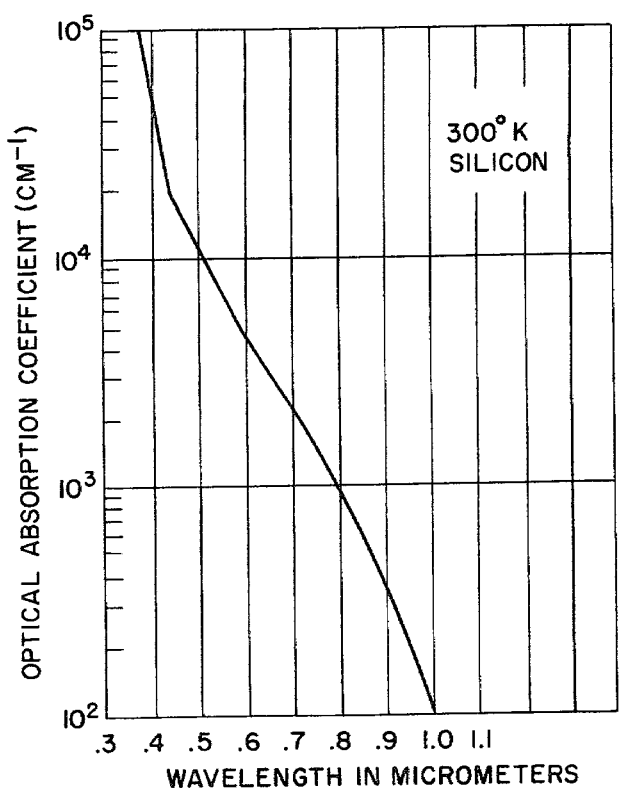
FIG. 5 illustrates the optical absorption coefficient of silicon with respect to the wavelength of impinging photons.
Figure 6:
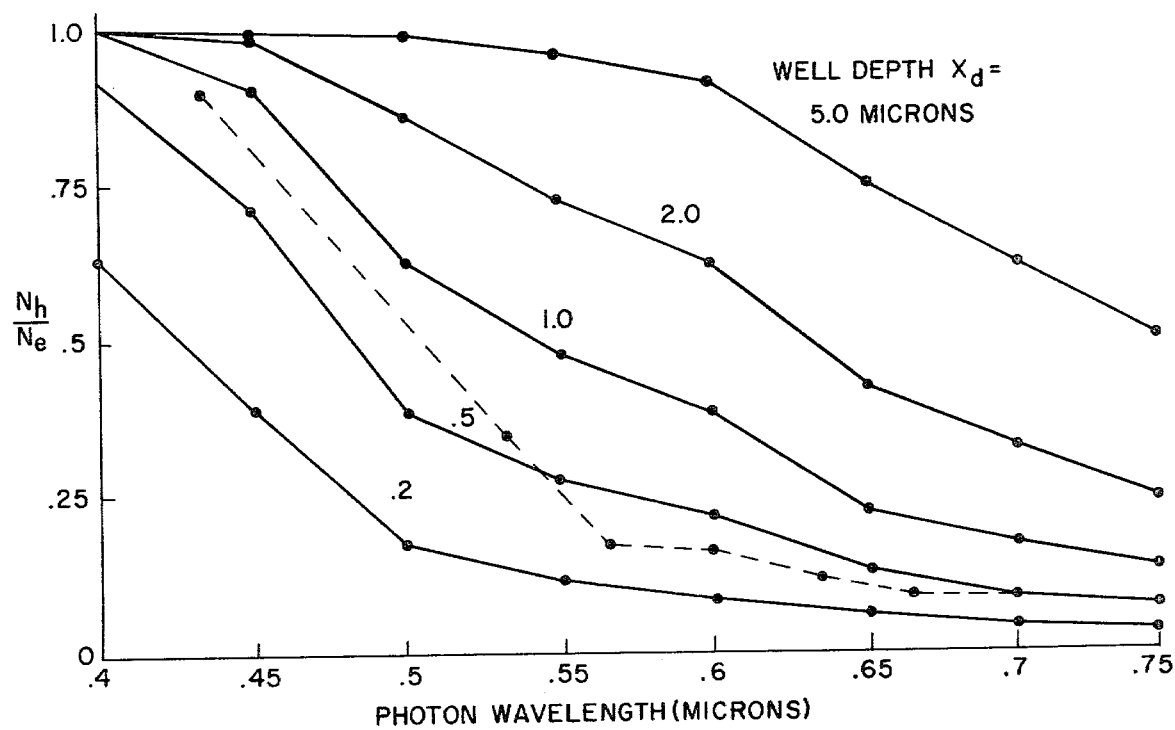
FIG. 6 illustrates the ratio of the detected carriers for various well depths in a CCD device.

FIG. 5 illustrates the optical absorption coefficient $\alpha$ of silicon with respect to the wave length of the impinging photons. Using the values of $\alpha$ from FIG. 5 in the above noted simplified equation, one can obtain a family of curves as illustrated in FIG. 6 of the drawings. It is to be noted from FIG. 6 that the ratio $N_h/N_e$ is a very strong function of the well depth $X_d$. FIG. 6 thus illustrates that for any one well depth $X_d$ (i.e.—any single curve in FIG. 6) the wavelength of the impinging photons may be determined from the ration Nh/Ne. Accordingly, by arranging a CCD so that the ratio Nh/Ne may be discerned, such a CCD can inherently determine the wavelength of impinging photons.

Figure 7:
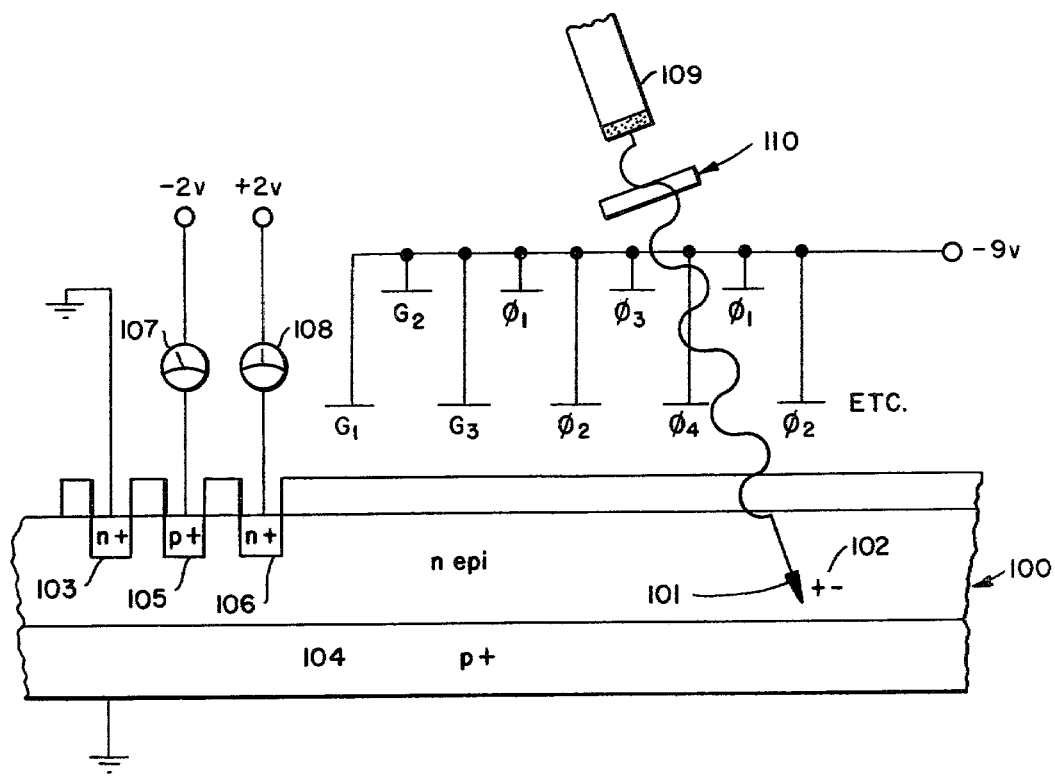
FIG. 7 illustrates a cross-sectional view of an experimental device utilized to verify the spectral response ratio equations.

FIG. 7 illustrates the cross-sectional view of an experimental device used to verify the above-noted equation. The device consisted of a 130 cell N-channel peristaltic charge transfer device 100 having a photo sensitive channel due to the misalignment of the upper and lower gates in the four phase charge transfer device structure. Photons 101 could impinge through the gate gaps and generate hole-electron pairs 102 as a propagated through the silicon substrate. The experimental device had a unique channel stop structure which permitted photogenerated holes which had diffused or had been field transported to the surface and then to the channel stop to be separately collected. The photogenerated electrons were measured by monitoring the current which flows from the imput diode of the device. The device was operated with its N+ outer ring 103 and substrate 104 grounded. Gates $\phi_1$, $\phi_2$, $\phi_3$, $\phi_4$, $G_1$, $G_2$, and $G_3$ were then negatively biased to minus 9 volts which established a buried channel and further provided a potential at the surface which would repel electrons and attract holes. The P+ guard ring 105 was negatively biased to minus 2 volts while the N+ input junction 106 was reversed biased to plus 2 volts. Current was monitored in the P+ and N+ bias lines by microammeters 107 and 108.

Impinging photons were provided by means of a microscope illuminator 109 arranged so as to radiate at an angle nearly normal to the surface of the device. Bandpass filters 110 having an optical passband of several Å and a known maximum passband wavelength were interposed between the illuminator 109 and the biased device 100 so as to be able to provide impinging photons with known characteristics. The separate hole and electron currents were then measured to determine the device response to the known impinging photon radiation. The dotted line in FIG. 6 corresponds to the experimental results obtained with the device illustrated in FIG. 7 of the drawings. Note that the experimental results bear a strong correspondance to the calculated values.

The following is a derivation of the storage equations for a two carrier charge coupled device in accordance with the present invention. These equations may be used by one skilled in the art to calculate the various parameters (e.g.—voltages and dimensions) for a charge coupled device in accordance with the present invention. In deriving the equations, it has been assumed that depletion approximation to solutions for Poisson's equation is valid and it has also been assumed that the doping profiles can be adequately represented by a two-parameters model, (i.e.—a layer representation in which only concentration and layer thickness are needed to describe the doping density adequately).

Figure 8:
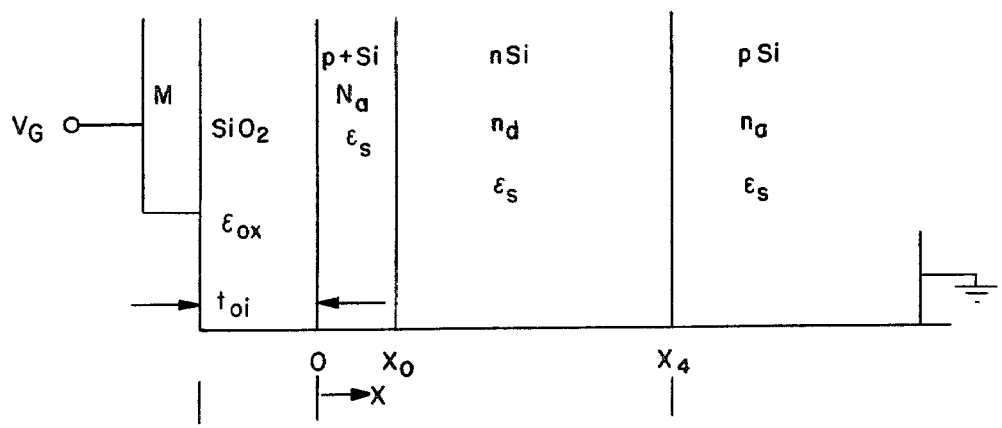
FIGS. 8 and 9 are respectively dimensional representations of hole and electron storage regions of CCD devices.

FIG. 8 illustrates a dimensional representation of the hole storage region of a charge coupled device. The storage layer structure required to collect and confine mobile holes are illustrated. Note that at a zero gate bias voltage, the number of carriers stored per unit area is equal to the product $N_a X_o$. It has been assumed that gate oxide thickness may need to be varied from one structure to another and the double subscript $t_{oi}$ is used to represent oxide thickness at the appropriate location.

Figure 9:
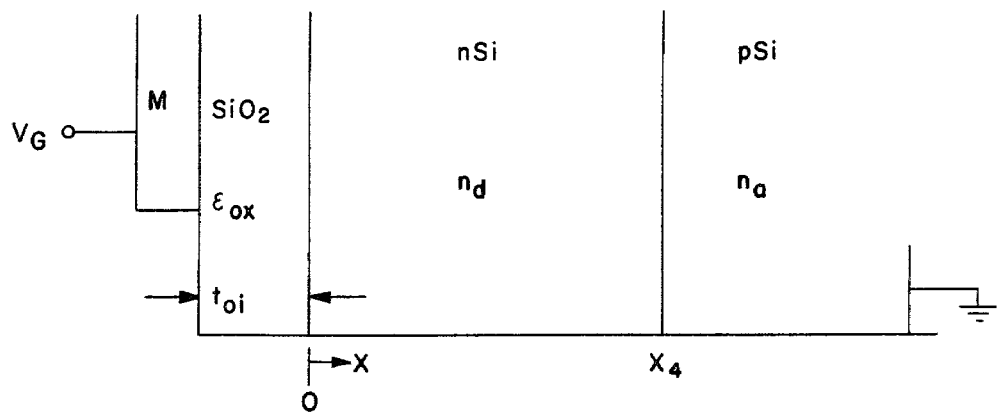

In a similar fashion, FIG. 9 illustrates a dimensional representation of the electron storage region of the charge coupled device. It differs from the hole storage structure in that no holes will reside at the oxide/silicon interface at a zero gate voltage. In contradistinction, since its interface layer is doped with a dopant such a phosphorus, arsenic or antimony to form an N-layer, the resident carriers in such a region would be mobile electrons.

The following is a listing of the various parameters used in the derivation of the equations:

$t_{oi}$ = thickness of insulator in cm. (typically $1-2 \times 10^{-5}$ cm)
$\epsilon_{ox}$ = insulator dielectric constant (for $SiO_2$- $\epsilon_{ox} = 3.4 \times 10^{-13}$ farads/cm)
$\epsilon_s$ = semiconductor dielectric constant (for Si $\epsilon_s = 1.06 \times 10^{-12}$ farads/cm)
$X_o$ = P-type or hole storage layer thickness in cm
$X_4$ = N-doped or electron storage layer thickness in cm
$n_a$ = P-type substrate doping density in cm$^{-3}$
$n_d$ = electron storage layer doping density in cm$^{-3}$
$N_a$ = P-type hole storage layer doping density in cm$^{-3}$

ELECTRON STORAGE WELL POTENTIAL EQUATION DERIVATION

Figure 10:
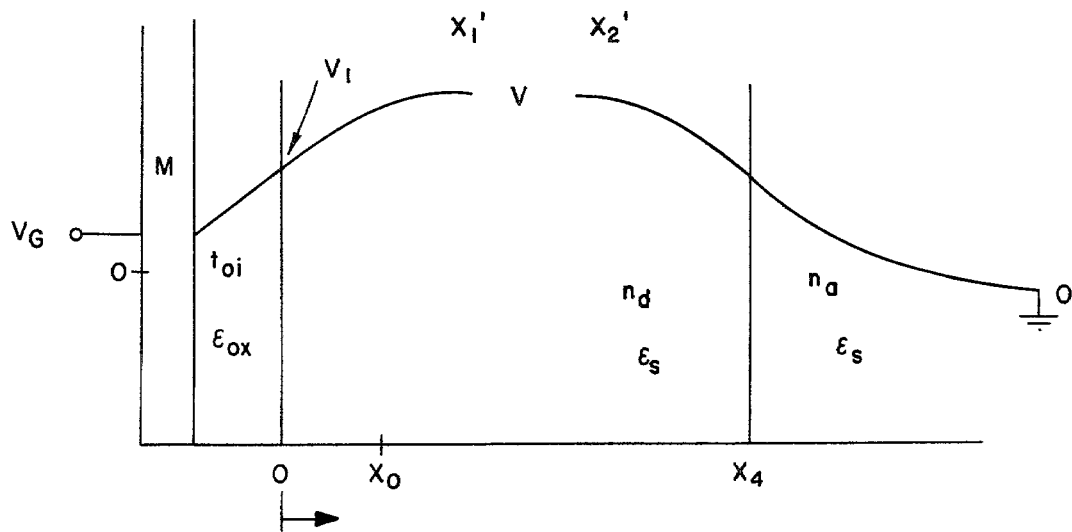
FIGS. 10 and 11 respectively illustrate the electron and hole storage potential of a CCD structure.

To properly optimize the parameters and predict the performance of a CCD structure in accordance with the present invention it is first necessary to derive equations which which relate the potential everywhere in the channels and structure of both hole and electron storage regions to the applied gate bias voltage and the above listed parameters. Consider first the electron storage potential as illustrated in FIG. 10 of the drawings. The storage of the electrons occurs between $X_1'$ and $X_2'$ because of the fact that a layer of undepleted carriers exists in equilibrium. Because of the fact that these carriers are in equilibrium, the electric field in the layer is zero. Accordingly, over the entire stored layer, one can assume that the electron storage voltage is equal to V. Even when the electron well is empty and $X_1'$ merges into $X_2'$, the field will pass through a zero value at this point and the potential of the empty channel may be calculated. When the well stores charge, the locations of $X_1'$ and $X_2'$ define V in terms of $V_g$ and the other parameters. When the well is empty, the entire channel potential is a continuous single valued function whose only independent variable is $V_g$.

Assuming that the dopant densities are uniform and the boundary fields are equal to zero, the following four equations are noted.

$$V_1 - V_G = E_{ox} t_{oi}$$
$$V - V_1 = \frac{e n_d X_1'^2}{2\epsilon_s}$$
$$V_2 = \frac{e n_a (X_5 - X_4)^2}{2\epsilon_s}$$
$$V - V_2 = \frac{e n_d (X_4 - X_2')^2}{2\epsilon_s}$$

Since no charge is stored at the interface (X=0), the electric field $E_{Ox}$ may be characterized by noting that the first of Maxwell's equations states that the electric displacement vector normal to the dielectric boundary is conserved in the absence of charge. Thus, by substituting the device parameters into the first of Maxwell's equations, the following equality may be obtained:

$$\epsilon_{ox} E_{ox} = \epsilon_s E_{so}$$

Where $E_{so}$ is equal to the field in the device with X slightly greater than zero. By integrating over the doped area, the following equation is obtained:

$$E_{so} = e n_d X_1'/\epsilon_s$$

By manipulating the above-noted equations, the following equation which defines the electron storage wall front is obtained:

$$V - V_G = \frac{en_d X_1' t_{oi}}{\epsilon_o} + \frac{en_d X_1'^2}{2\epsilon_s}$$

Using either the principal of matching fields at $X_4$ or the principal of charge neutrality across a depletion region and combining two of the above-noted equations the following equality is derived.

$$n_d(X_5' - X_4) = n_a(X_4 - X_2')$$

Substituting and rearranging the parameters, the following equality is derived:

$$V_2 = \frac{n_d(X_5' - X_4)^2}{2\epsilon_s} = \frac{en_a}{2\epsilon_s} \frac{n_d^2}{n_a^2} (X_4 - X_2')^2$$

By substituting and rearranging the parameters, the following equation which uniquely describes the electron backwall potential may be derived.

$$V = \frac{en_d}{2\epsilon_s}\left[1 + \frac{n_d}{n_a}\right](X_4 - X_2')^2$$

The storage of charge between the region from $X_2'$ to $X_2'$ at a bias level V is given by the following equation:

$$Q_{electrons} = -e\, N_{electrons} = -en_d(X_2' - X_1')$$

By rearranging parameters and substituting into the equations the following two equations for determining the values of $X_1'$ and $X_2'$ may be derived:

$$X_1' = -\frac{n_i \epsilon_s}{\epsilon_{ox}} + \left\{\left(\frac{t_{oi} \epsilon_s}{\epsilon_{ox}}\right)^2 + \frac{2\epsilon_s}{en_d}(V - V_G)\right\}^{\frac{1}{2}}$$

$$X_2' = X_4 - \left\{\left(\frac{n_a}{n_a + n_d}\right)\left(\frac{2\epsilon_s V}{en_d}\right)\right\}^{\frac{1}{2}}$$

In the above noted derivation, $V - V_G$ and $V$ must both be positive in value.

EMPTY ELECTRON WALL POTENTIAL EQUATIONS

The governing equations for an empty electron well can be calculated using the fact that $X_1 = X_2'$ when $Q_{electrons}$ is equal to zero. Substituting in the previous equations:

$$V_G = V - \frac{en_d t_{oi}}{\epsilon_o} X_2' - \frac{en_d}{2\epsilon_s} X_2'^2$$

where $$V = \frac{en_d}{2\epsilon_s}\left[1 + \frac{n_d}{n_a}\right][X_4 - X_2']^2$$

Multiplying out the squared term in the above-noted equation and rearranging terms, the following equation can be derived:

$$V_G = \frac{en_d}{2\epsilon_s}\left[1 + \frac{n_d}{n_a}\right][X_4^2 - 2X_2' X_4 + X_2'^2] - \frac{en_d t_{oi}}{\epsilon_{ox}} X_2' - \frac{en_d}{2\epsilon_s} X_2'^2$$

Next, this can be expanded to the form:

$$V_G = \frac{en_d}{2\epsilon_s}\left[1 + \frac{n_d}{n_a}\right] X_4^2 - \left\{\frac{en_d}{\epsilon_s}\left[1 + \frac{n_d}{n_a}\right] X_4 + \frac{en_d t_{oi}}{\epsilon_{ox}}\right\} X_2' + \frac{en_d}{2\epsilon_s}\left[\frac{n_d}{n_a}\right] X_2'^2$$

The above noted equation for $V_G$ is a quadratic equation in $X_2'$ and since $V$ and $V_G$ are related to $X_2'$, if the value of $X_2'$ can be derived, then the value of $V$ may be determined.

Solving the above noted equations and substituting, the following equations are derived:

$$X_2' = \beta - (\beta^2 - \gamma)^{\frac{1}{2}},$$

where $\beta = \left[1 + \frac{n_a}{n_d}\right] X_4 + \frac{n_a \epsilon_s t_{oi}}{n_d \epsilon_{ox}}$, and $\gamma = \left[1 + \frac{n_a}{n_d}\right] X_4^2 - \frac{2\epsilon_s n_a V_G}{en_d^2}$ and $$V = \frac{en_d}{2\epsilon_s}\left(1 + \frac{n_d}{n_a}\right)(X_4 - X_2')^2$$

Note that V may only be positive or equal to zero regardless of the value of $V_G$. Furthermore, $X_2'$ may only range in value from between zero to $X_4$ and is defined to always be positive. Since $\beta$ is always positive and greater than $X_4$, only the negative redical expression may be utilized when solving the above-noted equation for $X_2'$.

HOLE STORAGE WELL POTENTIAL EQUATION DERIVATION

Figure 11:
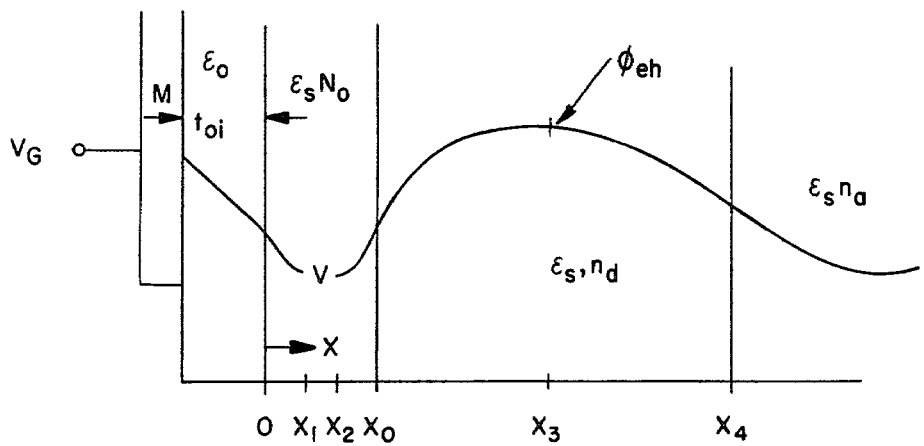

The following is a derivation of the necessary equations for the case in which holes are the carriers to be collected. The derivation is essentially analogous to that used with respect to the electron well derivation. FIG. 11 illustrates the hole storage potential and is analogous to FIG. 10 which illustrates the electron storage potential. As in the above-noted electron case, the following equations can be derived:

$$V_G - V = \frac{eN_a t_{oi} X_1}{\epsilon_{ox}} + \frac{eN_a X_1^2}{2\epsilon_s}$$

and $$V_3 - V = \frac{eN_a}{2\epsilon_s}(X_0 - X_2)^2$$

$$\phi_{eh} - V_3 = \frac{en_d}{2\epsilon_s}(X_3 - X_0)^2$$

$$\phi_{eh} - V_4 = \frac{en_d}{2\epsilon_s}(X_4 - X_3)^2$$

$$V_4 = \frac{en_a}{2\epsilon_s}(X_5 - X_4)^2$$

Using the fact that the field is continuous at the interface located at $X_4$, the following equation is derived:

$$n_a(X_5-X_4)=n_d(X_4-X_3)$$

Substituting, combining, and eliminating terms, the following equations are derived:

$$\phi_{eh} = \frac{en_d}{2\epsilon_s}\left(1+\frac{n_d}{n_a}\right)(X_4-X_3)^2$$

$$\phi_{eh} - V = \frac{eN_a}{2\epsilon_s}\left(1+\frac{N_a}{n_d}\right)(X_0-X_2)^2$$

$$n_d(X_3-X_0) = N_a(X_0-X_2)$$

$$V = \frac{en_d}{2\epsilon_s}\left(1+\frac{n_d}{n_a}\right)\left(X_4-X_0-\frac{N_a}{n_d}(X_0-X_2)\right)^2 -$$

$$\frac{eN_a}{2\epsilon_s}\left(1+\frac{N_a}{n_d}\right)(X_0-X_2)^2$$

$$\phi_{eh} = V + \frac{eN_a}{2\epsilon_s}\left(1+\frac{N_a}{n_d}\right)(X_0-X_2)^2$$

$$X_3 = X_0 + \frac{N_a}{n_d}(X_0-X_2)$$

$$X_2 = X_0 + \left[\frac{n_a+n_d}{n_a-N_a}\right][X_4-X_0] \pm \left[\left[\frac{n_a+n_d}{n_a-N_a}\right]^2[X_4-X_0]^2 + \frac{n_d(n_a+n_d)(X_4-X_0)^2}{N_a(n_a-N_a)} - \frac{2\epsilon_s n_a V}{e(n_a-N_a)N_a}\right]^{\frac{1}{2}}$$

In solving the above-noted equation for $X_2$, it is to be noted that the signs must be selected such that $X_2$ is positive in value. Furthermore, $X_2$ can only range in value from between zero and $X_0$. Lastly, it is to be noted that if the term $\{[N_a+N_d]/[N_a-N_a]\}$ is a positive value, then a minus sign must be used in solving the above-noted equation for $X_2$ and if the term is negative, then a plus sign is used in solving for $X_2$.

The equation for the frontwall of the hole region may be solved to obtain the following equality:

$$X_1 = \left(\left(\frac{\epsilon_s t_{oi}}{\epsilon_{ox}}\right)^2 - \frac{2\epsilon_s(V-V_G)}{eN_a}\right)^{\frac{1}{2}} - \frac{\epsilon_s t_{oi}}{\epsilon_{ox}}$$

It is to be noted that V is less than $V_G$. The equation for the hole charge storage is thus:

$$Q_{holes} = eN_a(X_2-X_1)$$

EMPTY HOLE WALL POTENTIAL EQUATION

Having derived the equations pertaining to the storage of holes, the following is a derivation of the equation pertaining to the empty hole potential wall. We first start with the following equation:

$$V_G - V = \frac{eN_a X_1 t_{oi}}{\epsilon_o} + \frac{eN_a X_1^2}{2\epsilon_s}$$

By substituting and rearranging terms and expanding, the following equation is derived:

$$V = -\frac{eN_a}{2\epsilon_s}\left[1-\frac{N_a}{n_a}\right]X_0^2 - \frac{eN_a}{\epsilon_s}\left[1+\frac{n_d}{n_a}\right][X_4-$$

-continued $$X_0]X_0 + \frac{en_d}{2\epsilon_s}\left[1+\frac{n_d}{n_a}\right][X_4-X_0]^2 +$$

$$\frac{eN_A}{2\epsilon_s}\left[2X_2X_0\left[1-\frac{N_A}{n_a}\right] + 2\left[1+\frac{n_d}{n_a}\right][X_4-X_0]X_2\right] -$$

$$\frac{eN_A}{2\epsilon_s}\left[1-\frac{N_a}{n_a}\right]X_2^2$$

Assuming the hole well is empty and $X_1=X_2$, then the following two equations can be derived:

$$V_G - V = \frac{eN_a X_2 t_{oi}}{\epsilon_{OX}} + \frac{eN_a X_2^2}{2\epsilon_S}$$

$$\phi_{eh} = \frac{en_d}{2\epsilon_s}\left[1+\frac{n_d}{n_a}\right]\left[X_4 - X_0\left(1+\frac{N_a}{n_d}\right) + \frac{N_a}{n_d}X_2\right]^2$$

$$= \frac{en_d}{2\epsilon_s}\left[1+\frac{n_d}{n_a}\right]\left[X_4 - X_0\left(1+\frac{N_a}{n_d}\right)\right]^2$$

$$+ \frac{en_d}{\epsilon_s}\left[\frac{N_a}{n_d}\right]\left[(X_4-X_0\left(1+\frac{N_a}{n_d}\right)\right]\left[1+\frac{n_d}{n_a}\right]X_2$$

$$+ \frac{en_d}{2\epsilon_s}\left[1+\frac{n_d}{n_a}\right]\left[\frac{N_a}{n_d}\right]^2 X_2^2$$

And $$V_G = \frac{e}{2\epsilon_S}\left[-N_a X_0^2\left(1-\frac{N_a}{n_a}\right) -\right.$$

$$2N_a(X_4-X_0)X_0\left(1+\frac{n_d}{n_a}\right) +$$

$$\left. n_d\left(1+\frac{n_d}{n_a}\right)(X_4-X_0)^2\right] +$$

$$\left[\frac{eN_a t_{oi}}{\epsilon_{OX}} + \frac{eN_a}{\epsilon_S}\left(X_0\left(1-\frac{N_a}{n_a}\right) + \right.\right.$$

$$\left.\left.\left(1+\frac{n_d}{n_a}\right)(X_4-X_0)\right)\right]X_2 + \frac{eN_a^2}{2\epsilon_S n_a}X_2^2.$$

Substituting and rearranging terms, it can be shown that the following equation can be derived to determine the value of $X_2$:

$$X_2 = -\frac{b}{2} \pm \left(\frac{b^2}{4} - c\right)^{\frac{1}{2}} \text{ for the empty well,}$$

for the empty well,
where $$b = 2\left[\frac{n_a}{N_a}\right]\left[\left(\frac{t_{oi}\epsilon_s}{\epsilon_o}\right) + X_4\left(1+\frac{n_d}{n_a}\right) - X_0\left(\frac{n_d+N_a}{n_a}\right)\right].$$

and $$c = \left[ -X_0^2 \left( 1 - \frac{t_q}{t_q} \right) - 2X_0(X_4 - X_0) \right.$$

$$\left. - \frac{t_d}{t_q} \right) + \frac{n_d}{N_a} \left( 1 + \frac{n_d}{n_a} \right)$$

$$\left. (X_4 - X_0)^2 \right] \frac{n_a}{N_a} - \frac{2\epsilon_S V_G n_a}{q N_a^2}$$

The above-noted derivations apply to the situation in which there is only a single carrier type, namely either holes or electrons. However, in order to calculate the necessary perameters for an apparatus in accordance with the present invention, it is necessary to consider the interaction between hole and electron storage structures. Namely, it is necessary to use the superposition of the hole and electron storage curves for equal $V_G$. Normally, both electrons and holes may be stored in quantities ranging from zero to nearly the implant doping level for each carrier type. However, in actual operation, a charge coupled device gate will normally be either storing one carrier type or the other. If a cell stores both carrier types, it effectively represents a bridge of carriers between channels. Accordingly, it is only necessary to compile equations in which either one carrier or no carriers are stored. The superposition of each carrier equation set requires the following:

1. A hole storage area and an empty electron well must be combined.
2. An empty hole well and a storing electron well must be combined.

Figure 12:
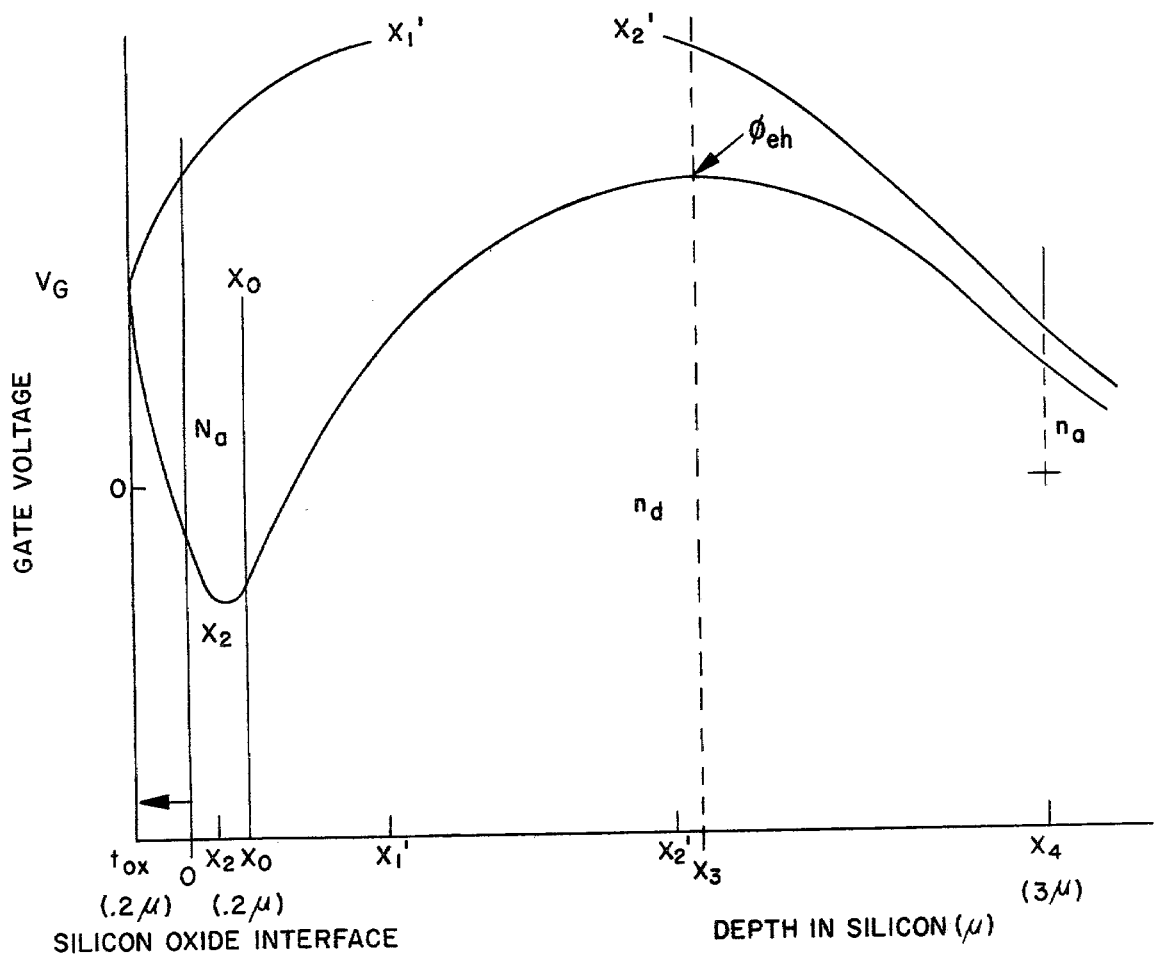
FIG. 12 illustrates the superposition of electron storage and empty hole well conditions.

Typically, a positive gate voltage is conductive to electron storage while a negative gate voltage is conductive to hole storage. FIG. 12 illustrates the superposition of electron storage and empty hole well conditions.

Once the equations have been combined using the superposition principal, it is important that if $0_{eh}$ is greater that V. then the hole channel is bridged with electrons and $X_2'$ merges toward $X_3$. Under these conditions, $X_2'$ and $X_3$ are controlled by V and the electron and hole channel back potentials become equal.

Figure 13:
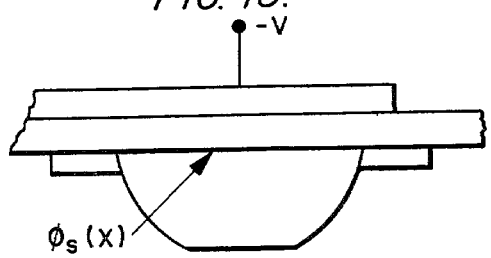
FIG. 13 illustrates the cross-sectional view of a charge transfer device.
Figure 14:
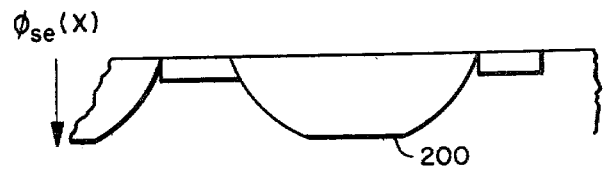
FIGS. 14 and 15 respectively illustrate the potential well of FIG. 13 as viewed by an electron and as viewed by a hole.
Figure 15:
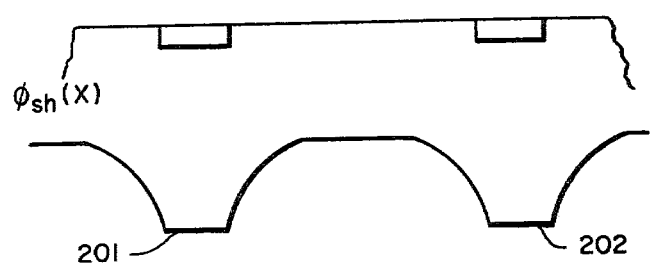

In prior art charge transfer devices, the structural element which serves as a channel stop also serves to collect carriers not being used to generate the information signals. If one views the cross-section of a prior art charge transfer device, it can be noted that charge collects in the bottom of the potential well. FIG. 13 illustrates the cross-sectional view of a charge transfer device. FIG. 14 illustrates the potential well of FIG. 13 as viewed by an electron while FIG. 15 illustrates the cross-sectional view of FIG. 13 showing the potential well as viewed by a hole. For each carrier type, the bottom of the potential well is defined differently. For the buried channel device illustrated in FIG. 13, mobile electrons are collected along the channel minimum 200 as illustrated in FIG. 14. However, for mobile holes, the potential is reversed and the holes are forced to a potential minima located at the channel stops 201 and 202 as illustrated in FIG. 15. In most prior art charge transfer devices, the channel stops are heavily conductive and their potential level is not easily shifted by the external drive gate. In contradistinction, in a CCD device in accordance with the present invention, rigid channel stops are not provided so that the device is capable of storing and propagating both holes and electrons simultaneously.

Figure 16:
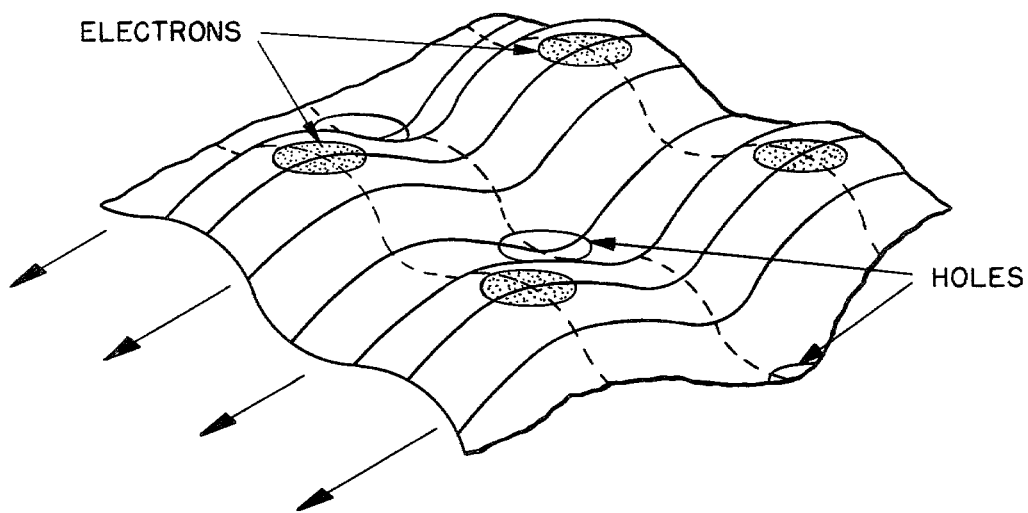
FIG. 16 illustrates the localized packets of charge condensed in a CCD imager in accordance with the present invention.

Normally, a CCD imager in accordance with the present invention has the following features:
1—Multiple layer structure (three or more layers).
2—A four-phase clock drive (either push or sign wave).
3—The absence of rigid channel stops.
4—An output detector for each spectral channel contained on the device.
5—The device is arranged such that holes and electrons travel down interspersed channels, but the centroid of each charge packet is offset one-half cell from its nearest neighbor of opposite type. FIG. 16 illustrates this arrangement.

Figure 17:
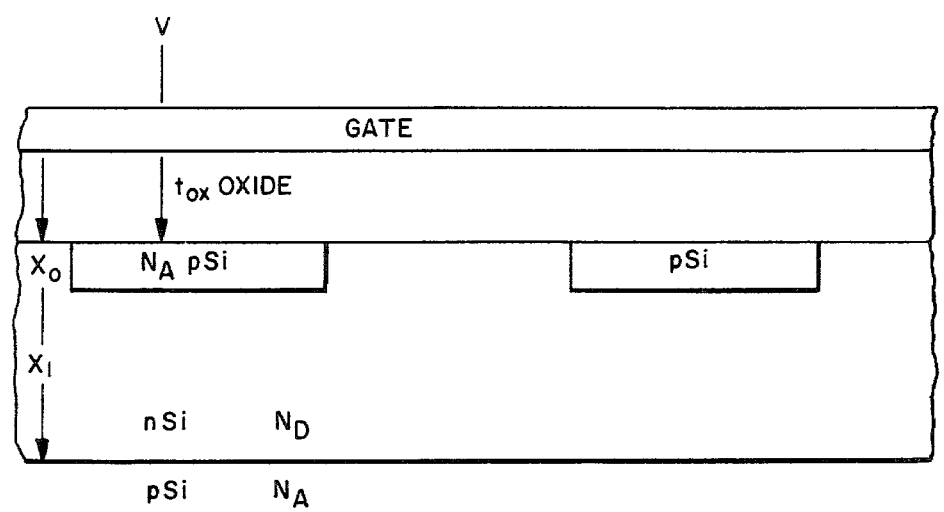
FIGS. 17 and 18 respectively illustrate a cross-sectional view of a CCD device structure and its potential distribution.
Figure 18:
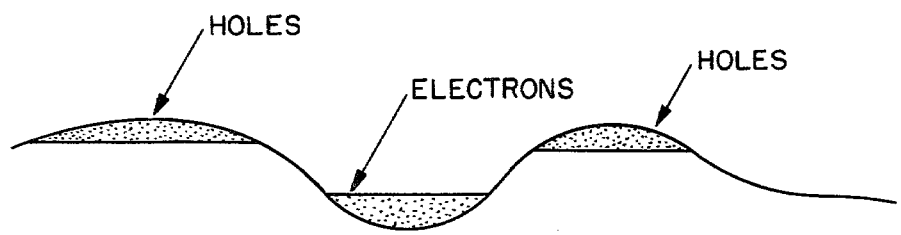

FIGS. 17 and 18 illustrate a cross-sectional view of a CCD device structure and its potential distribution arranged so as to be capable of providing suitable channels for both holes and electrons. Note that if V=0, the equilibrium density profile as illustrated in FIG. 18 provides stable storage for both holes and electrons. While this requires careful optimization of the dopant and depth parameters for the device, the previously stated equations may be solved using conventional computer program techniques in order to determine the optimized dopant and depth parameters.

Figure 19:
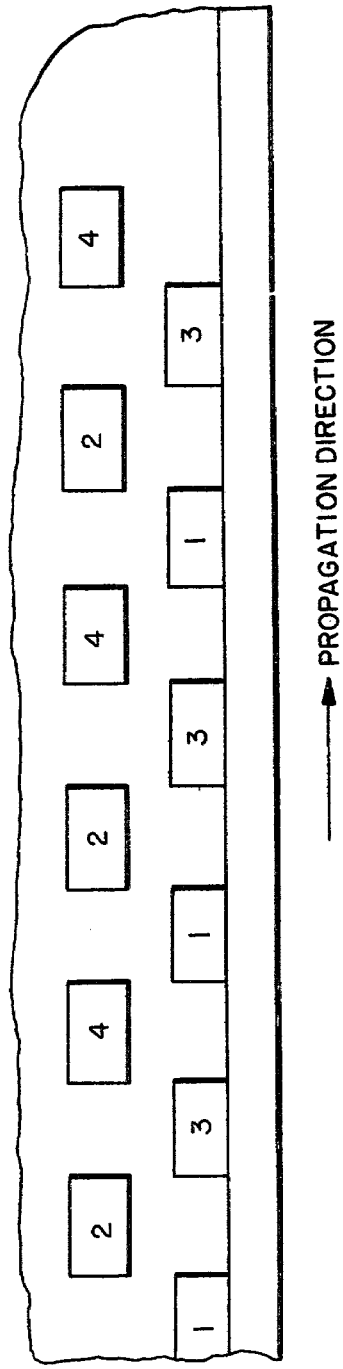
FIGS. 19 and 20 respectively illustrate the "along track" pictures and density profile for the CCD structure illustrated in FIG. 17.
Figure 20:
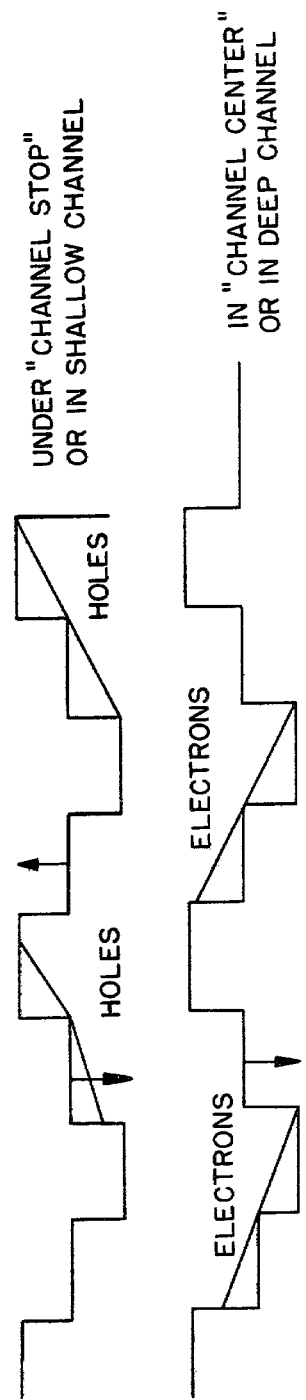

FIGS. 19 and 20 illustrate the along track picture and density profile for the CCD structure illustrated in FIG. 17. Note that as the electrons are transported along in a four-phase clock sequence, the hole will, of course, gravitate toward the pattern maxima while the electrons will, of course, gravitate in the opposite direction. This is due to the fact that the time varying voltages which repel a carrier of one charge would, of course, attract a carrier of opposite charge.

Another distinct advantage of a CCD imager using both holes and electrons as carriers is the fact that they are inherently protected against optical overload (i.e., blooming) because of the nature of their structure. Blooming occurs in prior art single carrier images because of the fact that carriers of one sign have been purposely transported away (i.e., collected by channel stops). Thus, when an excess of signal charge is generated (e.g., during the incidence of an unusually high intensity of impinging photons), it is difficult to remove this excess charge. Normally, a special set of drains and other structures are required to remove the excess signal generated as well. In contradistinction, in a two-carrier device in accordance with the present invention, since both holes and electrons are transported along adjacent half channels as illustrated in FIG. 16, it is apparent that local over-simulation of carriers due to the incidence of unusually high intensity impinging photons will be compensated automatically by the recombination of the electrons and holes in the cell itself without recourse to special additional structures and devices. Thus, the use of a CCD imager capable of operating with both holes and electrons inures the further advantage of being resistant to blooming.

Figure 21:
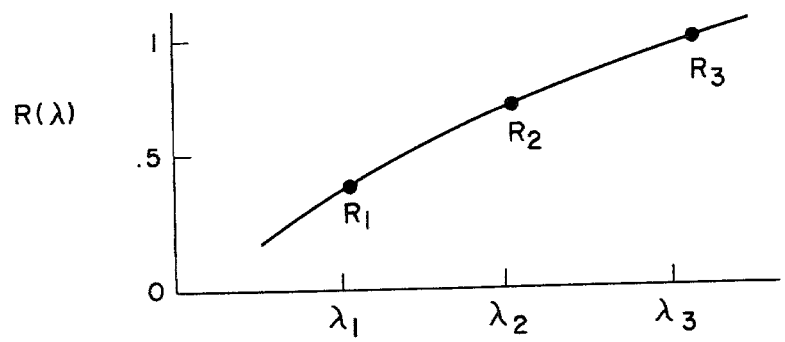
FIG. 21 illustrates the sensor response curve for a two-parameter CCD sensor.

FIG. 21 illustrates the sensor response curve for a two-parameter sensor. The sensor response R which represents the hole/electron ratio is plotted against the wave length $\lambda$ of the impinging photons. Knowing the sensor response R, FIG. 21 could be used to determine the value of the wavelength of the illuminating photons. However, it is necessary to have some a priori knowledge of the distribution of the illuminating photons in order that the two-parameter sensor provides complete spectral information. For example, the sensor can sort out any spectral wavelength providing that the source of illumination is of a single frequency or at the very least has the bulk of its spectral energy in a very narrow bandwidth. The two-parameter sensor can be used to determine the temperature of a blackbody providing that the blackbody is known to be a blackbody and no other sources of spectral energy are present.

However, even if a two-parameter sensor is used in an attempt to obtain the spectral information radiated by an unsaturated scene (i.e.—the impinging photons radiated by such a scene) information as to the peak of the source spectrum may be determined from the two-parameter sensor response if the degree of desaturation of the scene is known. The illumination is assumed to consist of a white illumination source in combination with an illumination source of a single spectral wavelength. This assumption provides sufficient a priori information to obtain meaningful spectral information from the two-parameter sensor. The illumination radiated by a partially saturated scene on a single element can be described by the following equation:

$$R(S) = SR(\lambda) + (1-S)R_u$$
$$\text{where } R_u = \frac{1}{\lambda_u - \lambda_L} \int_{\lambda_L}^{\lambda_u} R(\lambda)d\lambda$$

and S = saturation parameter equal to 1 for spectral lines and 0 for smoothly distributed uniform illumination from $\lambda_L$ to $\lambda_u$ Conversely, the sense data from partially saturated scenes can be obtained if S is known by calculating:

$$R(\lambda) = \frac{1}{S} R(S) - \frac{1-S}{S} R_u$$

Thus, if there is a priori knowledge of the degree of saturation of the scene, the spectral content of a resolution element can be sensed to a degree sufficient to provide meaningful spectral data.

Using previously generated empirical calibration data for a two-parameter sensor (i.e., $R_1$, $R_2$, $R_3$ as illustrated in FIG. 21), the spectral parameters r, g, b can be calculated using the following table:

| Parameter | Wavelength Region | |
|---|---|---|
| | $\lambda < \lambda_2$ | $\lambda > \lambda_2$ |
| r | $\dfrac{R_2 - R(\lambda)}{R_2 - R_1}$ | 0 |
| g | $\dfrac{R(\lambda) - R_1}{R_2 - R_1}$ | $\dfrac{R_3 - R(\lambda)}{R_3 - R_2}$ |
| b | 0 | $\dfrac{R(\lambda) - R_2}{R_3 - R_2}$ |

Thus, if the approximate level of desaturation for a scene is known, the quantity ($R(\lambda)$ can be derived using the above-noted equation for calculating $R(\lambda)$ based on the values of R(S).

Figure 22:
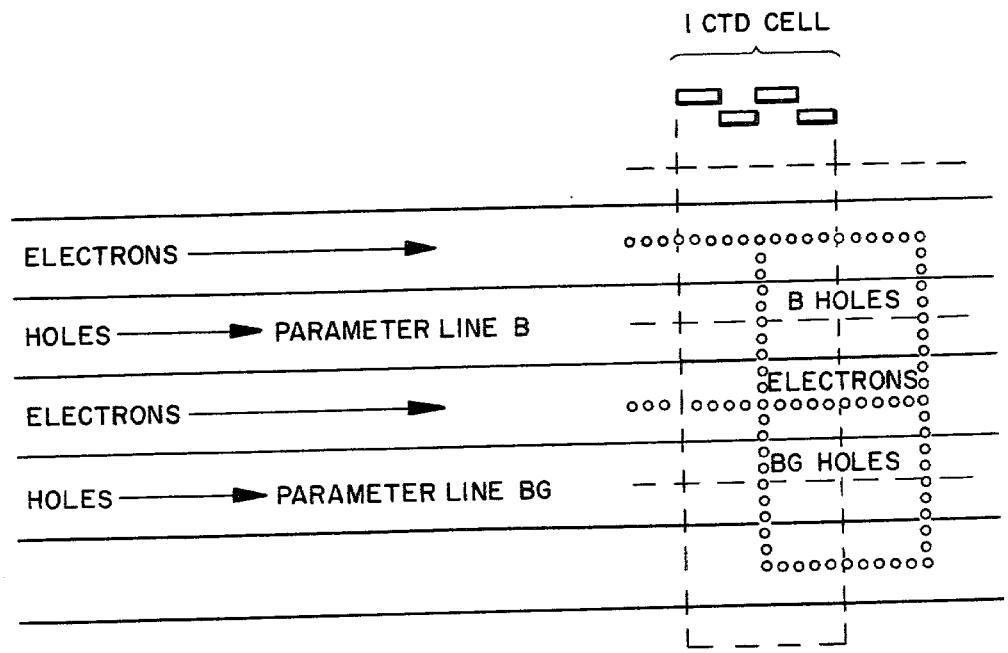
FIG. 22 illustrates a modified two-parameter CCD sensor.

FIG. 22 illustrates a modified two-parameter sensor arrangement for use as a three-parameter CCD imager. This sensor utilizes adjacent columns of cells having two different spectral responses. By utilizing this arrangement, each column can provide the above-noted two-parameter response and assuming that the photons impinging on one cell do not differ markedly from those impinging on an adjacent cell, the ratio of the responses of two adjacent cells may be used to determine additional spectral information unavailable from a single two-parameter cell.

As an alternative to the above-noted approach, a three-layer buried channel structure may be fabricated. The structure would consist of the two-layer, two-parameter sensor with an additional expitaxial layer and an additional set of output devices on the CCD chip.

It is well known that matrix processing can be utilized to connect the response of three different spectral sensors (each with unique spectral response as a function of photon energy) into three orthogonal sensors, for example, to drive a three color TV display.

Figure 23:
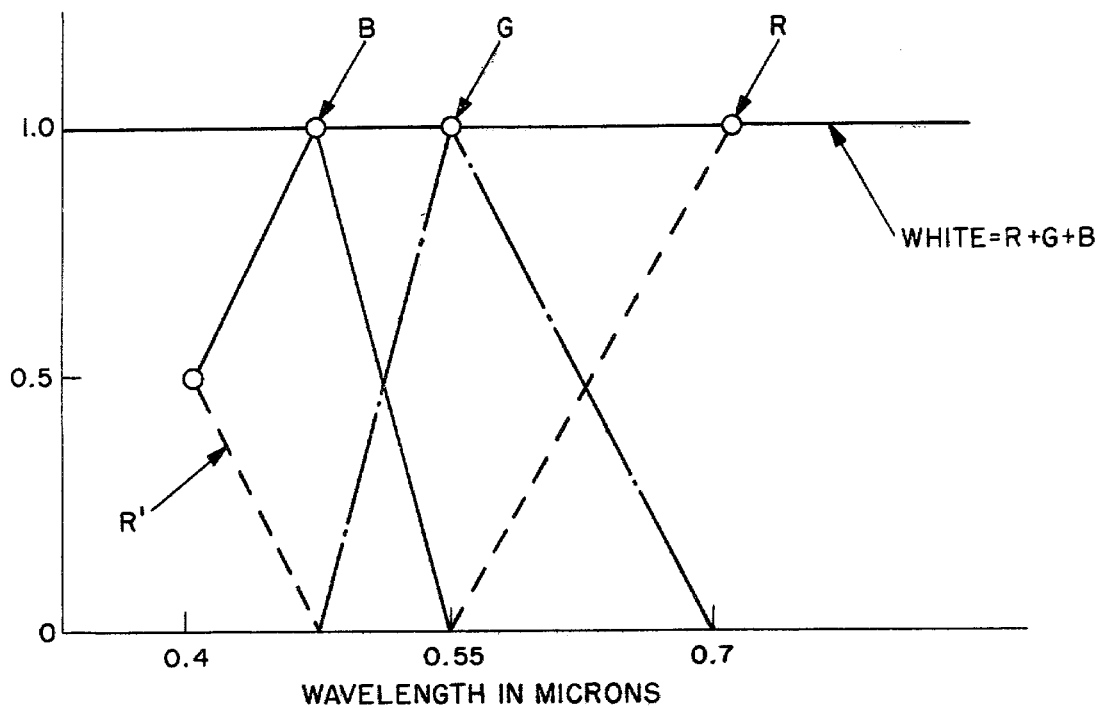
FIGS. 23 and 24 respectively illustrate the ideal and actual responses of a three-color CCD device in accordance with the present invention.
Figure 24:
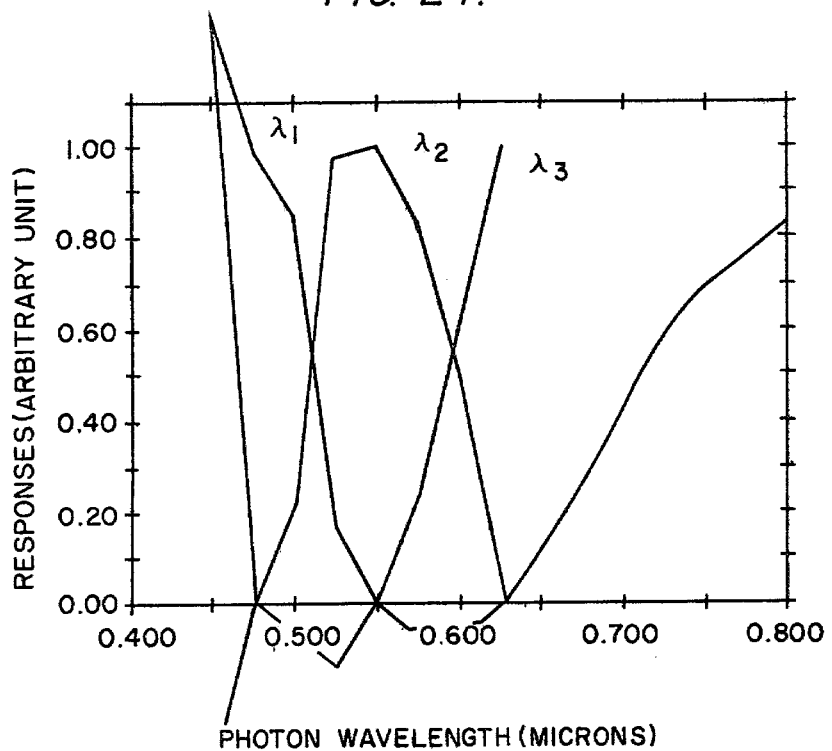

FIGS. 23 and 24 illustrate the ideal response of such a three-color sensor system and the actual response of a three-color sensor derived from sensor curves like those shown in FIG. 6.

I claim:

1. A multi-spectral charge coupled device for generating a plurality of signals representative of the spectral content of impinging photons comprising:
    a plurality of adjacent semiconductor layers arranged to generate a hole and an electron for each of said impinging photons;
    first and second collector means arranged to respectively collect said generated holes and electrons and respectively generate first and second signals representative of said generated holes and electrons;
    said semiconductor layers having a predetermined optical absorption coefficient and said first and second collector means arranged such that said first and second signals are indicative of the spectral content of the impinging photons.

2. A multi-spectral charge coupled device for generating a plurality of signals representative of the spectral content of a stream of photons impinging on the surface of said device comprising:
    a plurality of adjacent semiconductor layers arranged to generate a hole-electron pair for each photon of said photon stream, said hole-electron pair generated at a mean depth from the surface of said device which is a function of the wavelength of said respective photon;
    first and second collector means arranged to respectively collect said generated holes and electrons, said first and second collector means arranged at different depths from the surface of said device whereby the efficiency of collection of said holes and electrons are respectively different functions of the depth from the surface of said device at which said holes and electrons are generated; and
    output means, operatively connected to said first and second collector means for providing output signals representative of said generated holes and electrons whereby said signals are indicative of the spectral content of said impinging stream of photons.

3. A device in accordance with claims 1 or 2, wherein the ratio of the output signals from said first and second collector means are representative of the wavelength of said impinging photons.

4. In a multi spectral charge coupled device for generating a plurality of signals representative of the spectral content of impinging photons and comprising a plurality of adjacent semiconductor layers arranged to generate hole-electron pairs for each photon of a photon stream impinging upon the surface of said device, the improvement comprising first and second collector means for respectively collecting each of said holes and said electrons;
further comprising output means operatively connected to said first and second collector means for producing signals representative of said collected holes and electrons, whereby the ratio of said output signals representative of said collected holes and electrons is representative of the wavelength of said impinging photons.

5. A device in accordance with claims 1, or 2, wherein said device is arranged to contain a plurality of regions in a plane parallel to said surface of said device, and wherein the intensity of said impinging photons is determined by the relationship between the output signals of adjacent regions.

6. A multi-spectral charge coupled device as recited in claim 1 wherein
said plurality of semiconductor layers comprise multiple buried layer including a plurality of layers for generating holes, and
a plurality of layers for generating electrons interleaved with said plurality of layers for generating holes.

7. A device in accordance with claim 3, wherein said device is arranged to contain a plurality of regions in a plane parallel to said surface of said device, and wherein the intensity of said impinging photons is determined by the relationship between the output signals of adjacent regions.

* * * * *

UNITED STATES PATENT AND TRADEMARK OFFICE
CERTIFICATE OF CORRECTION

PATENT NO. : 4,229,754

DATED : October 21, 1980

INVENTOR(S) : Barry T. French

It is certified that error appears in the above-identified patent and that said Letters Patent are hereby corrected as shown below:

In the ABSTRACT, line 3, change "protons" to -- photons--.
Column 4, line 3, change the first two equations to read $$N_h = N_p \gamma \int_0^{X_2} \alpha e^{-\alpha x} C_h(x) \, dx$$

$$N_e = N_p \gamma \int_0^{X_4} \alpha e^{-\alpha x} C_e(x) \, dx$$

$C_i(x)$ = device collection function $N_p$ = no. of photons impinging per unit area $\alpha$ = optical absorption coefficient $\gamma$ = surface structure optical transmission coefficient Column 4, line 26, change "a" to -- an absorption -- and line 48, change "$N_3$" to -- $N_e$ --.

UNITED STATES PATENT AND TRADEMARK OFFICE
CERTIFICATE OF CORRECTION

PATENT NO. : 4,229,754

DATED : October 21, 1980

INVENTOR(S) : Barry T. French

It is certified that error appears in the above-identified patent and that said Letters Patent are hereby corrected as shown below:

Column 8, line 40, change "redical" to -- radical --.
Column 9, line 53, change "WALL" to -- WELL -- and line 56, change "wall" to -- well --.

Column 10, line 40, change "]2" to -- 2 -- and line 57 delete in its entirety.

Column 11, line 40, change "0" to read -- $\phi$ --.
Column 13, line 31, change "sense" to -- sene -- and line 57, change "(R" to -- R --.
Column 15, line 13, after "2," insert -- or 4, --.

Signed and Sealed this

Seventeenth Day of March 1981

[SEAL]

Attest:

RENE D. TEGTMEYER

Attesting Officer

Acting Commissioner of Patents and Trademarks

Notice of Adverse Decision in Interference

In Interference No. 101,053, involving Patent No. 4,229,754, B. T. French, CCD IMAGER WITH MULTI-SPECTRAL CAPABILITY, final judgment adverse to the patentee was rendered Jan. 3, 1986, as to claims 1-7.
[*Official Gazette April 1, 1986.*]